United States Patent
Rombach (10) Patent No.: US 9,356,570 B2
(45) Date of Patent: May 31, 2016

(54) HIGH SPEED, RAIL-TO-RAIL CMOS DIFFERENTIAL INPUT STAGE

(71) Applicant: TEXAS INSTRUMENTS DEUTSCHLAND GmbH, Freising (DE)

(72) Inventor: Gerd Rombach, Freising (DE)

(73) Assignee: TEXAS INSTRUMENTS DEUTSCHLAND GMBH, Freising (DE)

( * ) Notice: Subject to any disclaimer, the term of this patent is extended or adjusted under 35 U.S.C. 154(b) by 0 days.

(21) Appl. No.: 14/444,334

(22) Filed: Jul. 28, 2014

(65) Prior Publication Data

US 2015/0333705 A1    Nov. 19, 2015

Related U.S. Application Data

(60) Provisional application No. 61/993,943, filed on May 15, 2014.

(51) Int. Cl.
*H03F 3/45* (2006.01)
*H03F 1/02* (2006.01)
*H03F 3/30* (2006.01)

(52) U.S. Cl.
CPC .......... *H03F 3/45237* (2013.01); *H03F 1/0205* (2013.01); *H03F 1/0233* (2013.01); *H03F 3/3022* (2013.01); *H03F 3/45076* (2013.01); *H03F 3/45183* (2013.01); *H03F 2200/129* (2013.01); *H03F 2200/453* (2013.01); *H03F 2200/513* (2013.01); *H03F 2203/45066* (2013.01); *H03F 2203/45116* (2013.01)

(58) Field of Classification Search
CPC .............. H03F 1/0233; H03F 3/45076; H03F 2200/129; H03F 2203/45066; H03F 2203/45116
See application file for complete search history.

(56) References Cited

U.S. PATENT DOCUMENTS

| | | | |
|---|---|---|---|
| 5,061,907 A | 10/1991 | Rasmussen | |
| 6,788,112 B1* | 9/2004 | Chan | G11C 7/062 327/51 |
| 7,394,283 B2* | 7/2008 | Hsu | H03K 19/018528 326/115 |
| 7,567,628 B2* | 7/2009 | Darabi | H04L 25/0296 326/37 |
| 2003/0095003 A1* | 5/2003 | Li | H03F 3/45219 330/253 |
| 2005/0218986 A1* | 10/2005 | Garlepp | H03F 3/45183 330/259 |
| 2006/0097791 A1* | 5/2006 | Shuler | H03F 1/08 330/292 |
| 2007/0159249 A1* | 7/2007 | Nishimura | H03F 3/3022 330/253 |
| 2007/0222517 A1* | 9/2007 | Wu | H03F 1/26 330/258 |
| 2008/0252375 A1* | 10/2008 | Tso | H03F 3/3022 330/253 |

\* cited by examiner

*Primary Examiner* — Jason M Crawford
*Assistant Examiner* — Kurtis R Bahr
(74) *Attorney, Agent, or Firm* — Andrew Viger; Frank D. Cimino (57) ABSTRACT

An apparatus is provided, comprising a single-ended input stage with signals IN_P & IN_N as input and OUT_P & OUT_N as output, wherein the differential input controlled by transistors P1-3 and N1-N3; and a means for weighting (sizing) of transistor (P1 & P3) relative to P2 and (N1 & N3) relative to N2 defines the optimal operation mode.

5 Claims, 11 Drawing Sheets

HIGH SPEED, RAIL-TO-RAIL CMOS DIFFERENTIAL INPUT STAGE

PRIORITY

This application claims the benefit of Provisional Application No. 61/993,943, filed May 15, 2014, entitled "High Speed, Rail-to-Rail CMOS Differential Input Stage," which is incorporated by reference in its entirety for all purposes.

TECHNICAL FIELD

This Application is directed, in general, to a rail to rail differential input stage and, more specifically, to a high speed, rail to rail CMOS differential input stage.

BACKGROUND

In high speed digital VLSI designs, input buffers comply with the (LV) TTL interface standard, which is good enough for most applications. These input buffers are simple CMOS inverter based receivers. However, when timing becomes critical, matching between differential clocks and data signal streams are important, input signals vary in swing and common mode, such buffers are not sufficient.

State of the art receivers are complex and their design is a compromise between high speed, input offset voltage, input common-mode range, power consumption, etc.

Wide input common-mode receivers are built-on NMOS/PMOS differential (complimentary) pair with folded cascode and with a common mode feedback amplifier. Such operational amplifiers are well described in the open literature. Normally, they do not reach high speed, consume a lot of power (especial in inactive mode) and require a settling time.

On the other hand are these very fast input receivers with a reduced input common mode voltage range, e.g. simple CMOS inverters operating in push-pull fashion, self-biased CMOS receivers.

Figure 1:
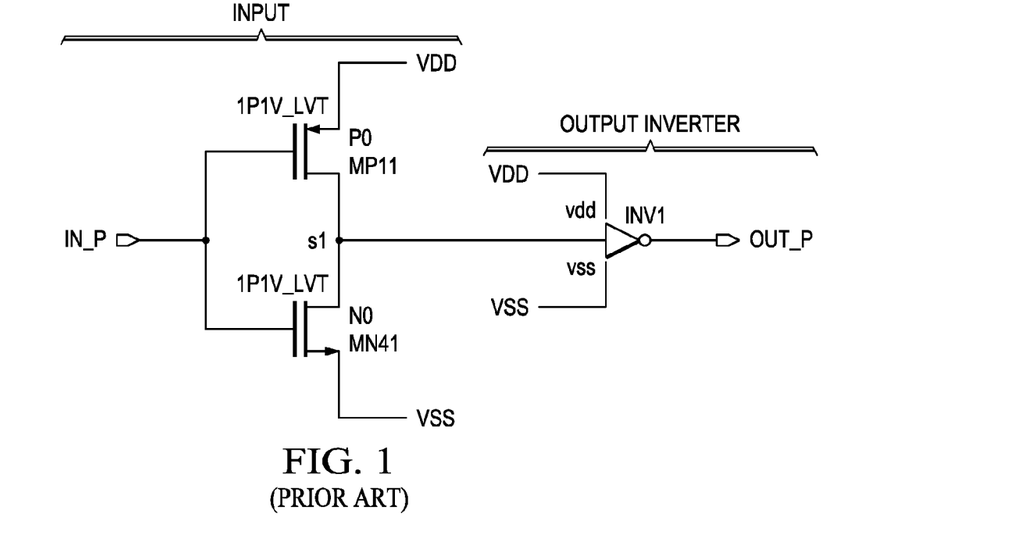
FIG. 1 illustrates a prior art input stage.

Turning to FIG. 1, illustrated is a prior art two-stage CMOS inverter based receiver. The input threshold, the output duty-cycle and the delay time changes a lot over process, supply and temperature (PVT) variations. Moreover, the duty-cycle and the delay time depend on the input signal amplitude and level. For most applications it's sufficient but moving on to higher speed, critical timings and low supply this basic stage cannot be used.

SUMMARY

A first aspect provides an apparatus, comprising: a differential input stage with signals IN_P & IN_N as input and OUT_P & OUT_N as output.

A second aspect provides an apparatus comprising: g: a single-ended input stage with signals IN_P & IN_N as input and OUT_P & OUT_N as output.

A third aspect provides an apparatus, comprising an apparatus, comprising a single-ended input stage with signals IN_P & IN_N as input and OUT_P & OUT_N as output, wherein the differential input controlled by transistors P1-3 and N1-N3; and a means for weighting (sizing) of transistor (P1 & P3) relative to P2 and (N1 & N3) relative to N2 defines the optimal operation mode.

BRIEF DESCRIPTION OF THE DRAWINGS

Reference is now made to the following descriptions.

DETAILED DESCRIPTION

Figure 2A:
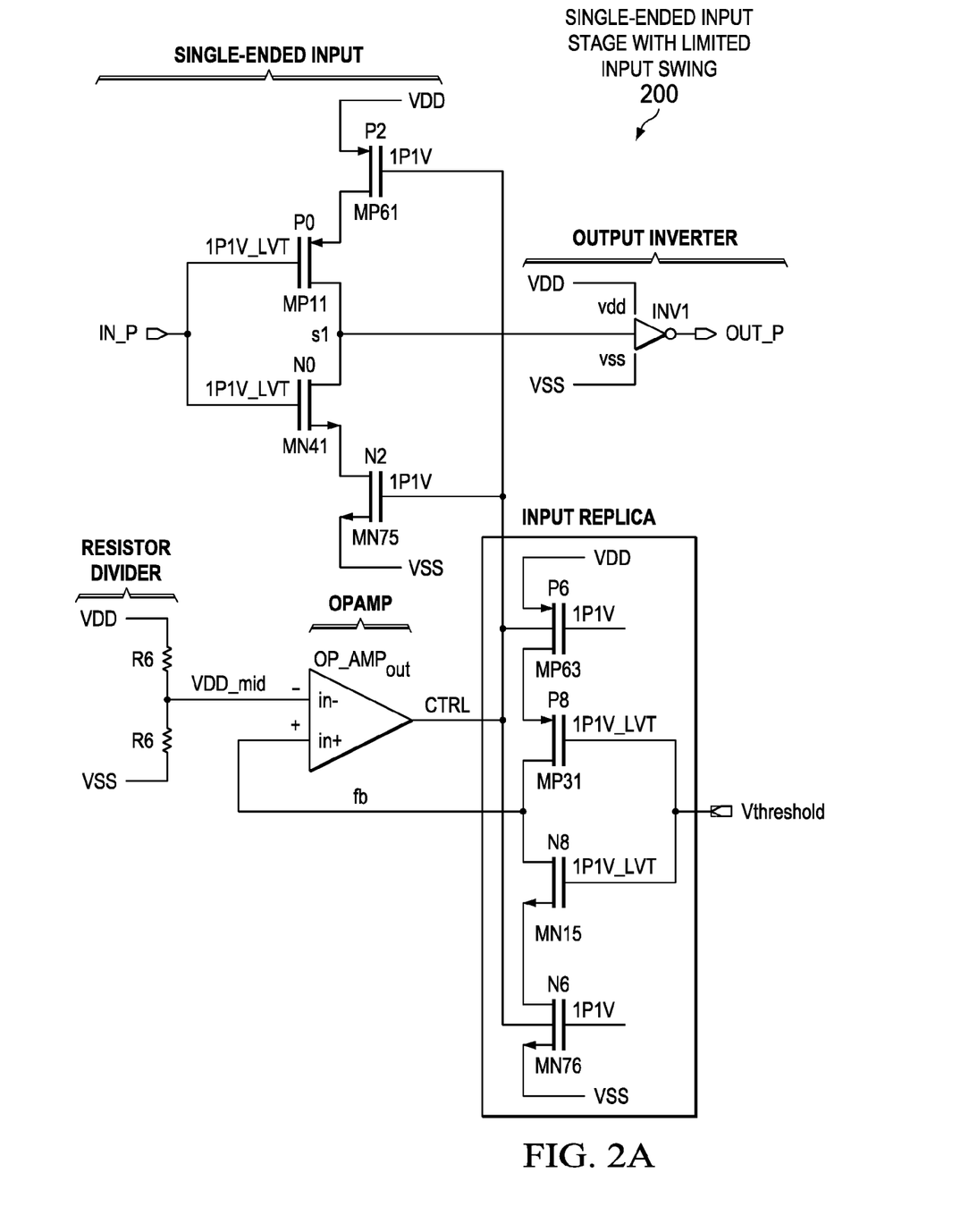
FIG. 2A illustrates a single ended input stage with a limited input swing.

Turning to FIG. 2A, illustrated is a circuit 200 with a modification with decreased input threshold sensitivity is illustrated. A control loop set in input threshold to a pre-defined voltage (at pin 'Vthreshold'). Transistor P2 and N2 connects the input inverter to the supply and a replica of this inverter is connected to 'Vthreshold'.

For a given voltage at 'Vthreshold', the op-amp controls the output voltage of the inverter to be VDD/2 (set by the resistor divider). The gain of the second inverter 'INV1' could be optimized for VDD/2 when proper designed.

The characteristics of the input receiver described here are: high speed, wide input common mode range, constant small-signal and large-signal behavior, constant duty-cycle and a zero settling time.

The new input stage behaves like a very fast CMOS inverter based stage when the input signal has a high swing and the input common-mode voltage is in the middle. When the input signal swing is small and the input common-mode voltage becomes close to the power rails, it behaves like a NMOS or PMOS differential input pair with a current source load and at least with one differential pair alive. The transition from one to the other operation mode is smooth.

Typical applications are the DDR3/4 registers and data-buffers supporting high speed clocks and random data-pattern streams. Matched single-ended and differential receivers with variable reference voltages are required. Power consumption is a big concern and therefore a fast enabling/disabling of the receivers is desired.

Figure 2B:
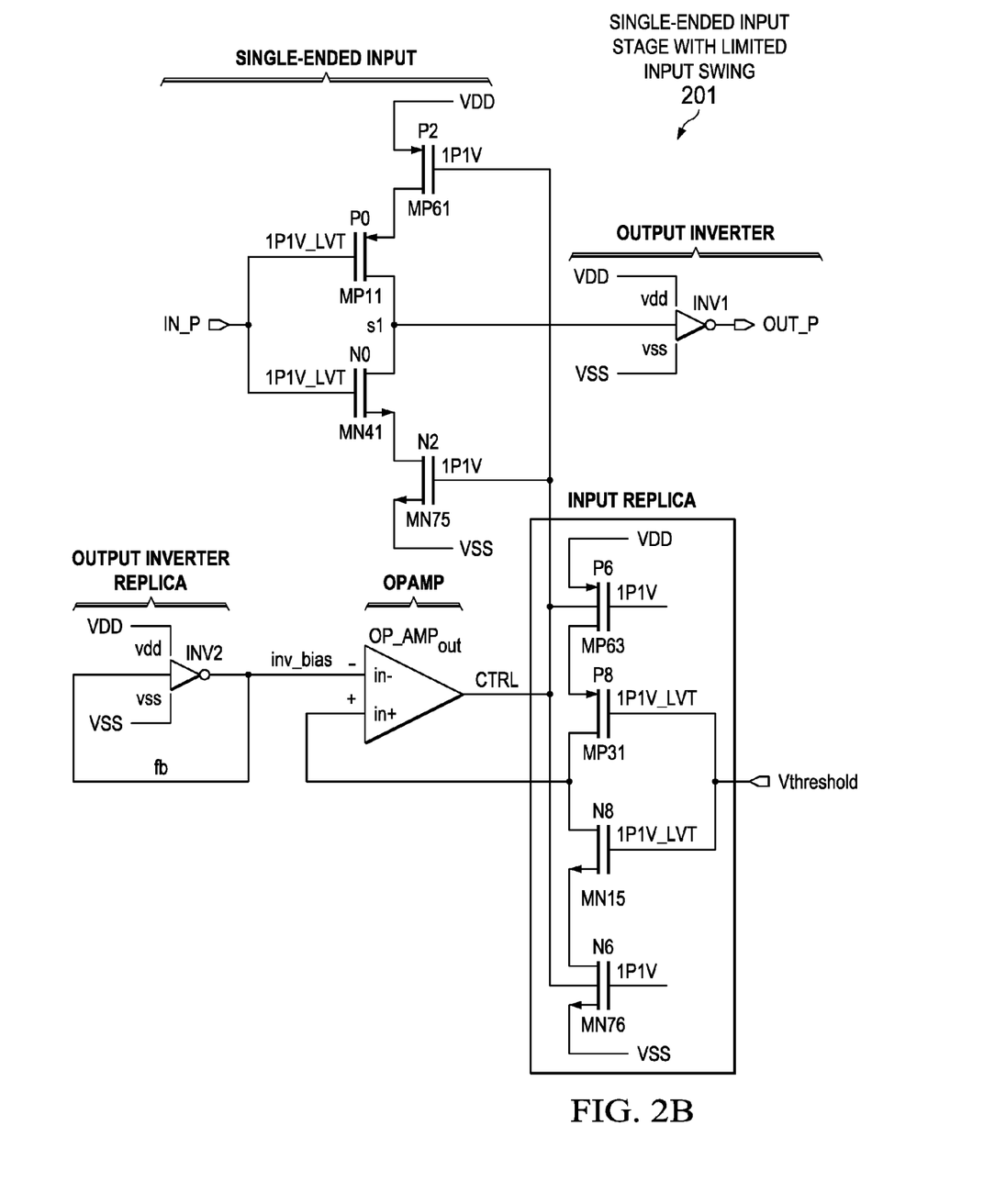
FIG. 2B illustrates a second single-ended input stage with a limited input swing.

Turning to FIG. 2B, illustrated with employment of a second step, a reference voltage at the op-amp is set to the switching point of the driver (INV1) 201. Inverter INV2 is a replica of INV1 and the output is shorted to the input. This self-biasing creates a negative-feedback and corrects any variations in processing parameters or operating conditions by shifting the biasing voltage away from their nominal values. Doing so, the duty-cycle will be improved and becomes independent on input swing and level. The control loop set the input threshold to 'Vthreshold' and biased the driver (INV1) to an adequate operation point. For a low input threshold, the op-amp switches the NMOS transistor N6 and N2 to a stronger drive value and the PMOS transistor P6 and P2 to a weaker drive value. For a high input threshold, the other way around. The same mechanism applies to PVT variations.

Figure 3:
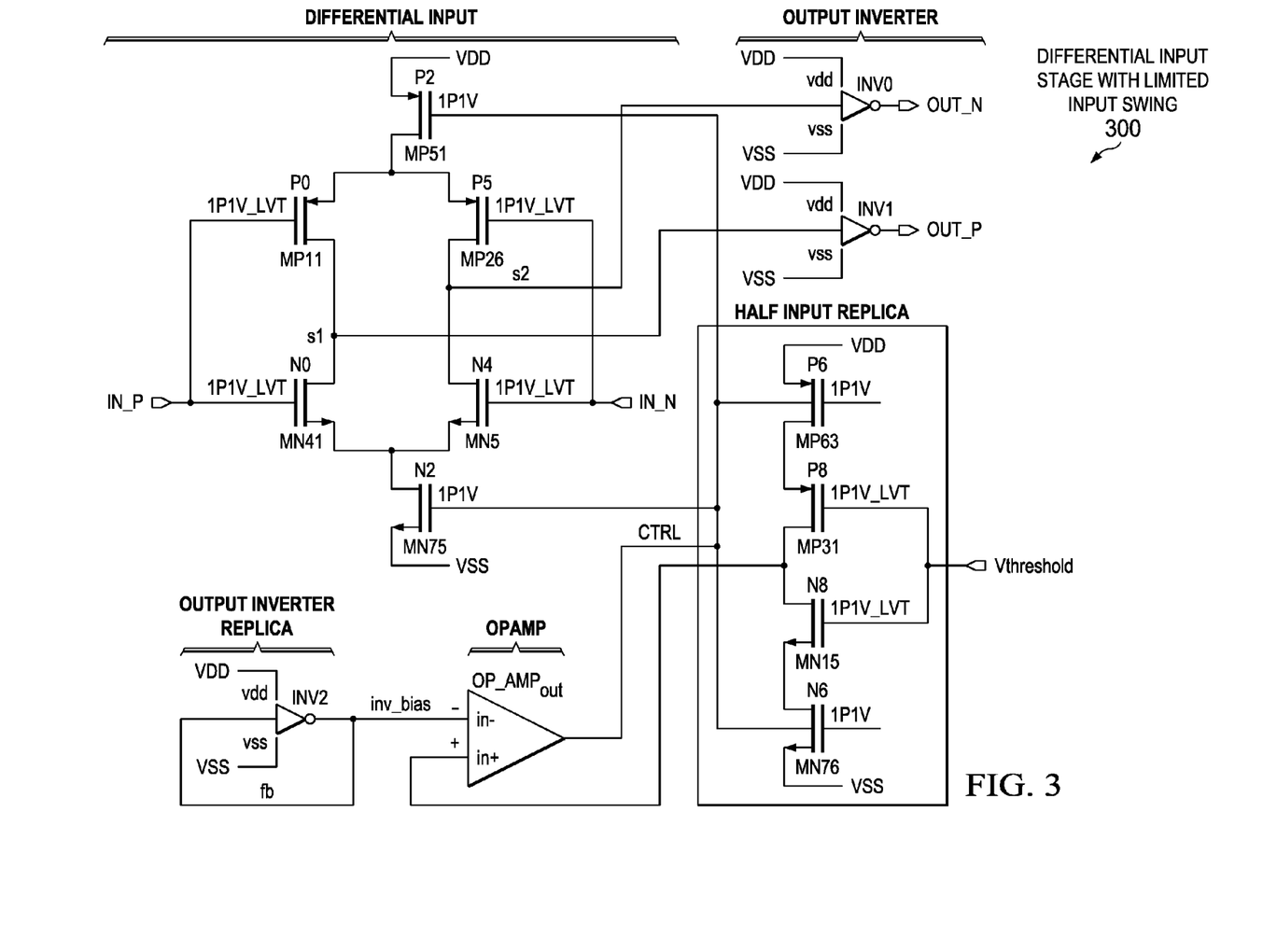
FIG. 3 illustrates a fully complementary configured rail to rail driver.

Regarding FIG. 3, a same principle can be used for differential input signals of an inverter 300. The inverter 300 is a fully complementary configured rail to rail driver. The biasing is accomplished through transistor P2 and N2. They are operating in the linear region and their source voltages are close to the supply rails. The output voltage swing will be rail-to-rail and the interface to the CMOS level becomes straight-forward therefore. The complementary structure leads to doubling the dc gain of the stage. For the input threshold and duty-cycle the same rules apply as describe above. The inverter circuit 300 works best when 'Vthreshold' tracks the input common mode voltage.

This is normally done by the employment of a common mode feedback circuit (CMFB). CMFB loops require a settling time and therefore would limit the applications for receivers with uninterrupted clock signals only. For applications where the incoming clock could be enabled/disabled or the data signal is a random data pattern, CMFB loops are not suitable. The describe circuit here requires a predefined common mode voltage.

This input stage has a limited input common mode range. When the input voltage falls below 'Vt_NMOS' or rise about 'VDD-Vt_PMOS', the circuit operates very weak or does not work anymore. Assuming both inputs are low, the transistors N0 and N4 are completely switched off. There is nothing that can pull node 's1' and 's2' to ground. For both inputs are high it's the other way around.

Figure 4:
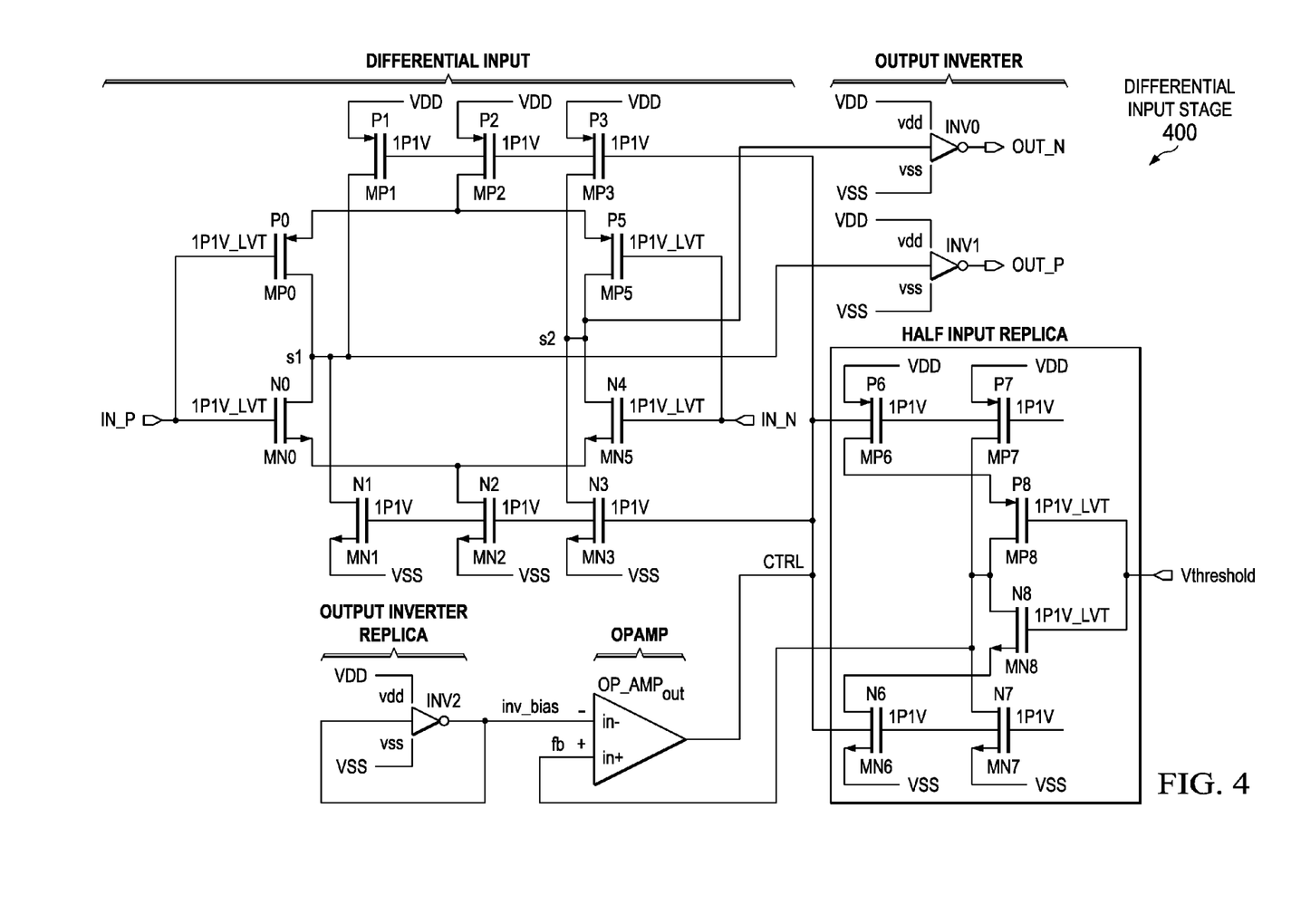
FIG. 4 illustrates another aspect of a rail to rail driver.

Turning to FIG. 4, only a few components are needed to widen the input common mode range as shown for a rail to rail driver 400. Current source loads (P1/N1, P3/N3) are added to node 's1' and node 's2' respectively. The same is done in the half replica circuit. They are connected to the same control voltage (CRTL) and are part of the control loop. Assuming the input common mode voltage is at a high level, such that the PMOS differential input pair is switched off.

Figure 5:
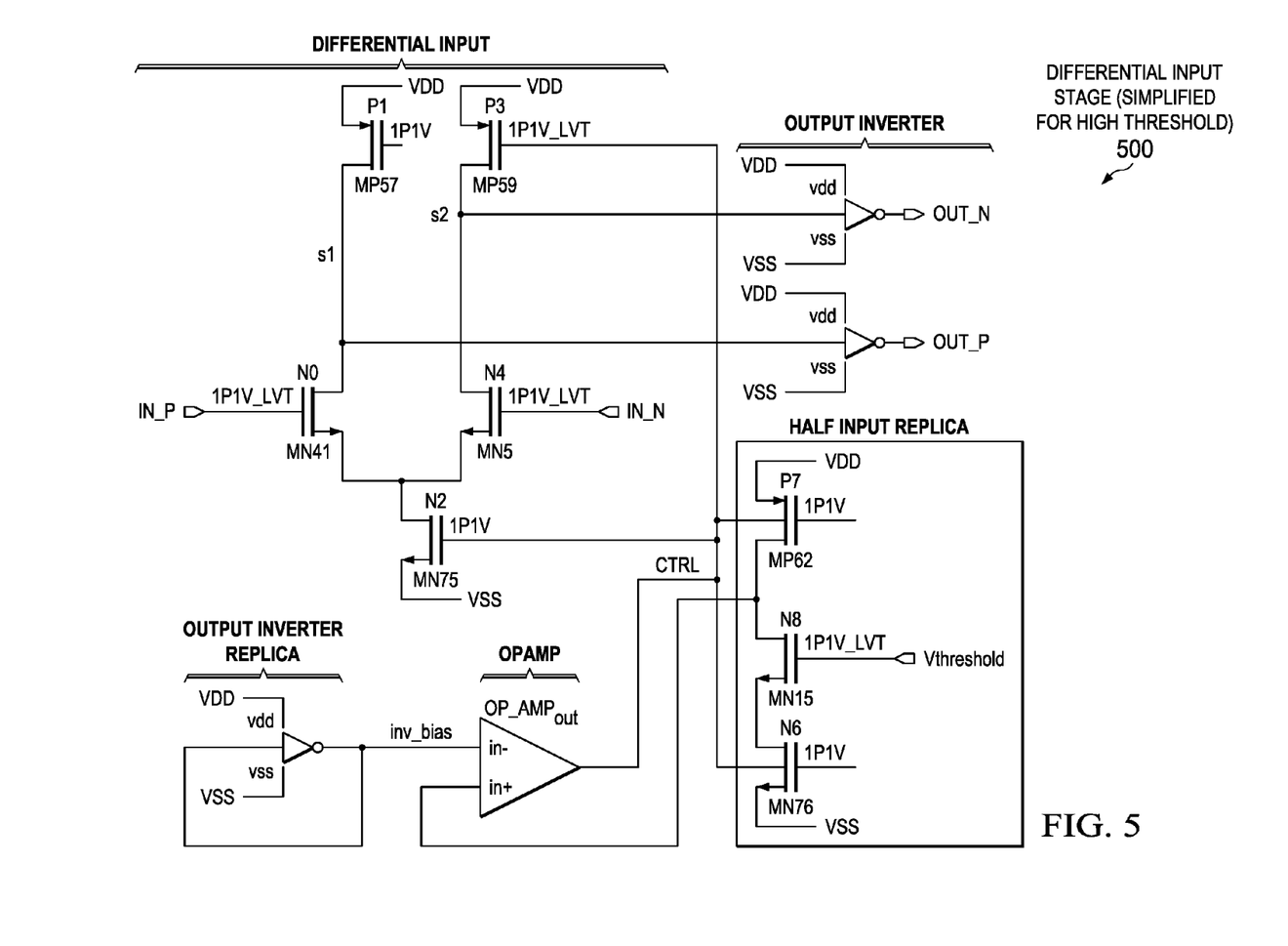
FIG. 5 illustrates an NMOS differential input pair with a PMOS current source load.

Turning to FIG. 5, the remaining, active circuit 500 is shown. It is a NMOS differential input pair with a PMOS current source load. A complementary picture can be drawn in case of a low level input common mode voltage.

The impact of each circuit part (operation like shown in FIG. 3 or more like shown in FIG. 5) depends on the input common mode level and the sizing of the transistors. The transition from one to the other mode is smoothly and overlapping.

Figure 6:
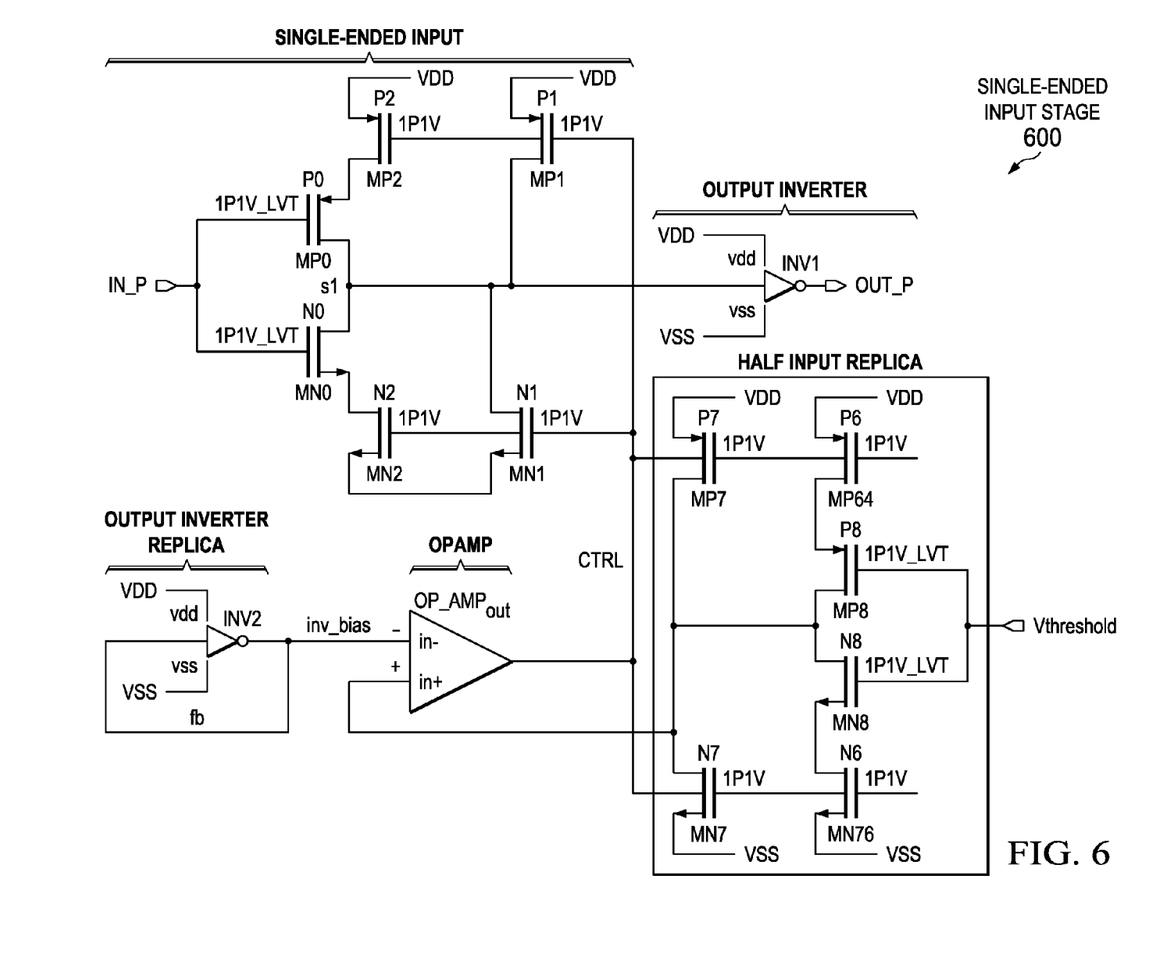
FIG. 6 illustrates an equivalent circuit for a single ended input.
Figure 7A:
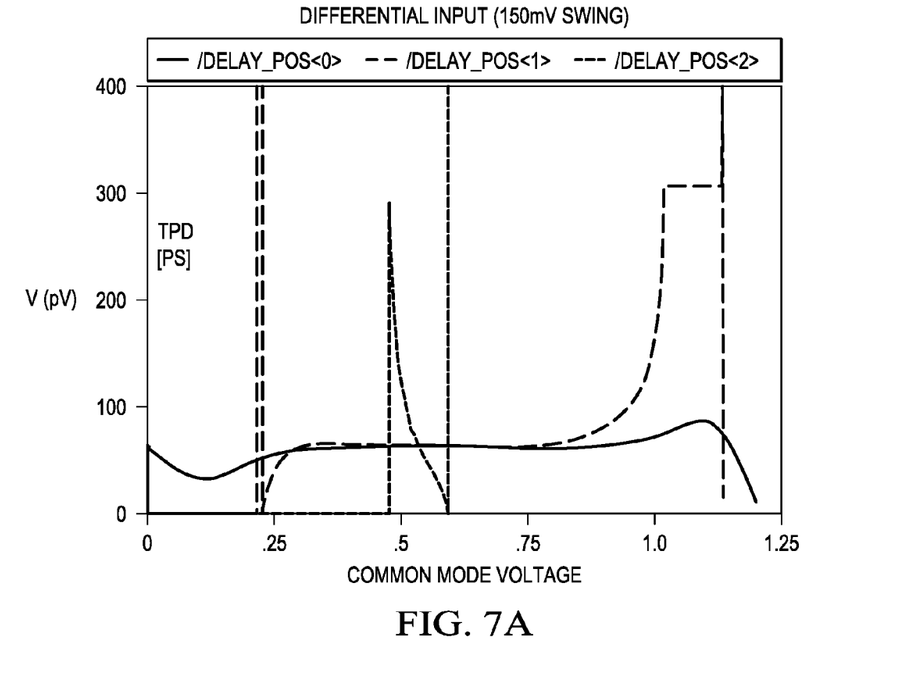
FIG. 7A-illustrates a first simulation of the various above circuits.
Figure 7B:
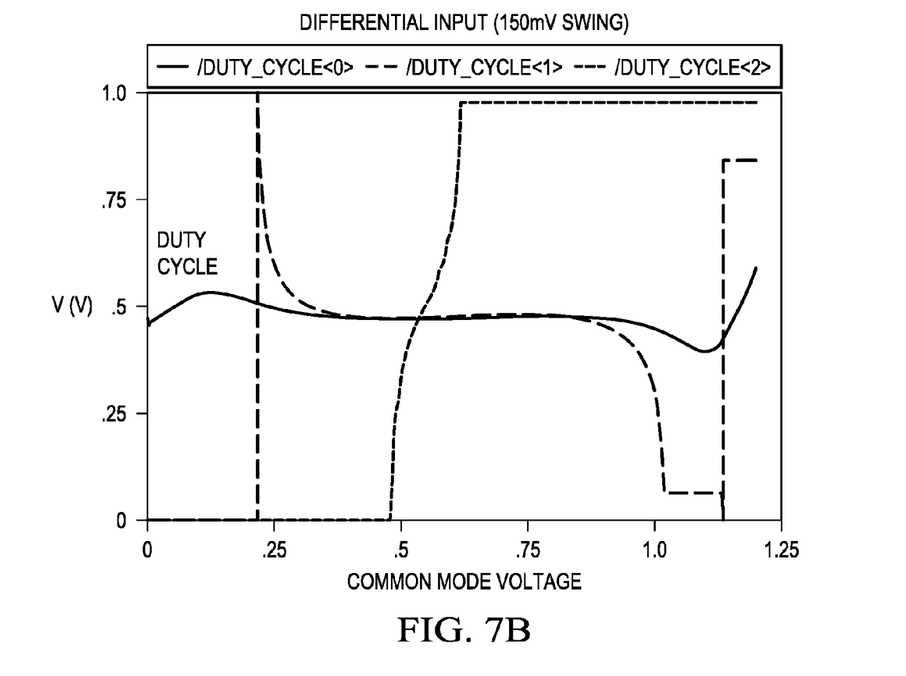
FIG. 7B illustrates a second simulation of the various above circuits.
Figure 7C:
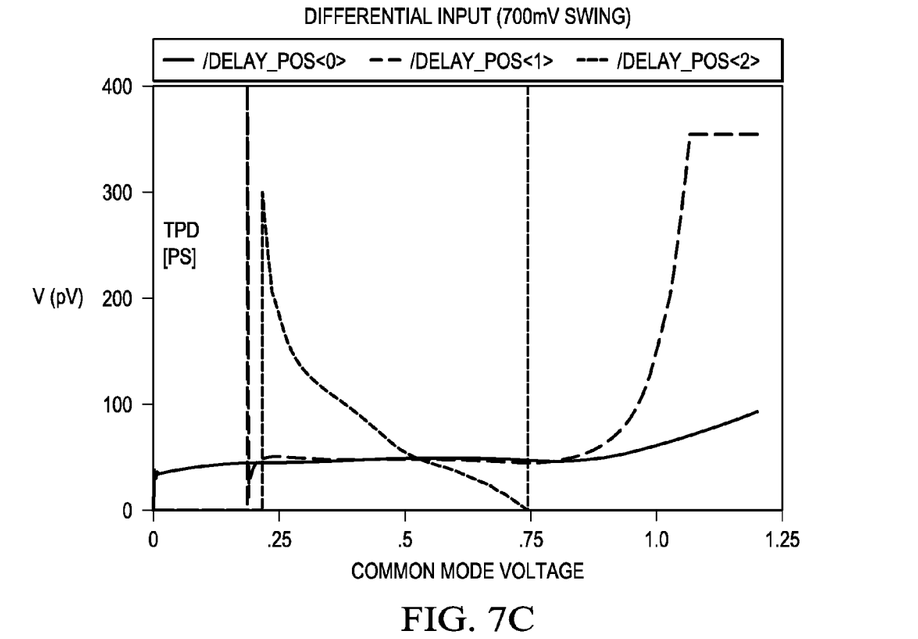
FIG. 7C illustrates a third simulation of the various above circuits.
Figure 7D:
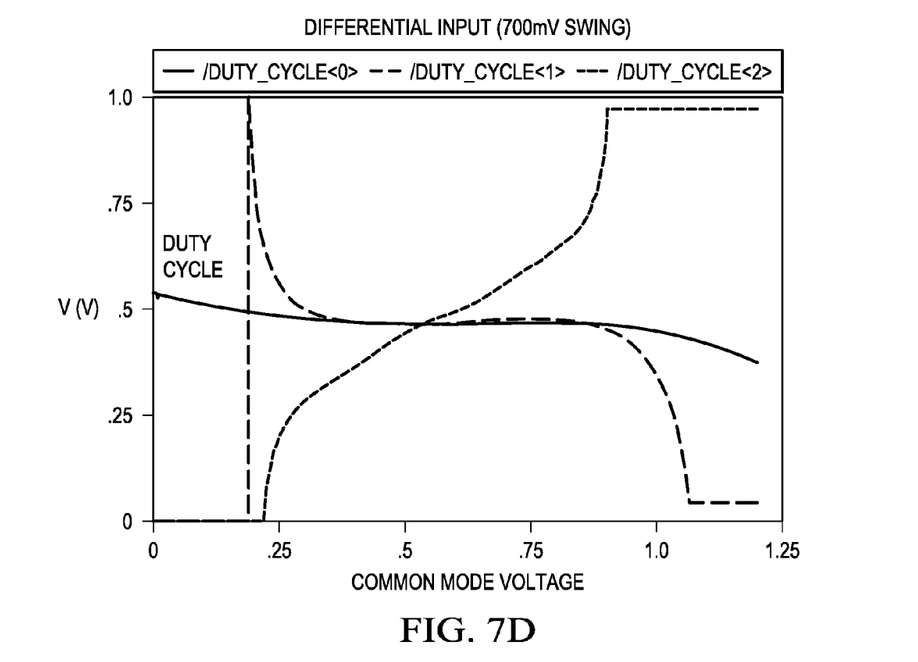
FIG. 7D illustrates a fourth simulation of the various above circuits.
Figure 7E:
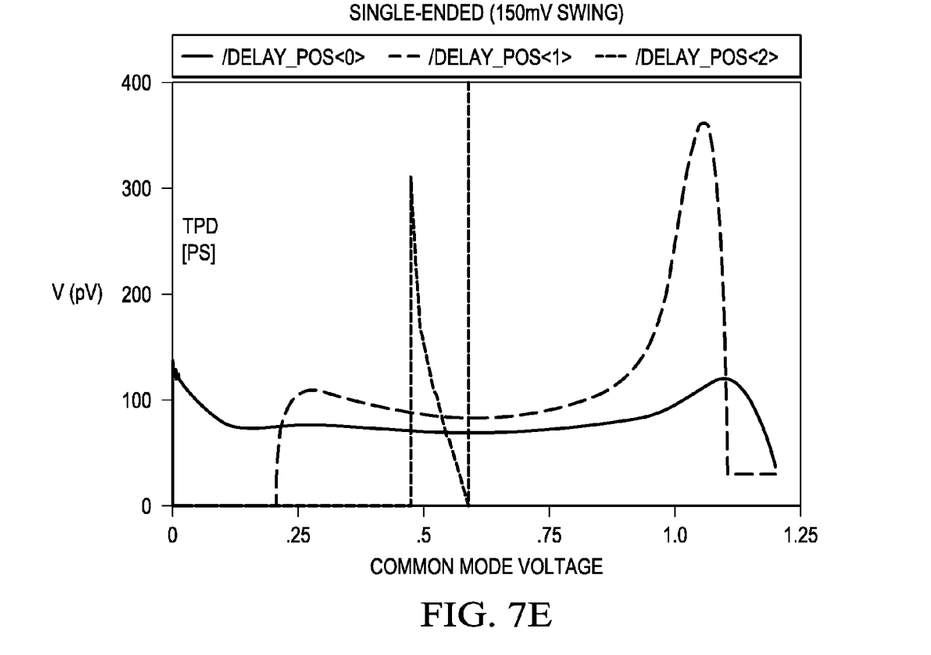
FIG. 7E illustrates a fifth simulation of the various above circuits.
Figure 7F:
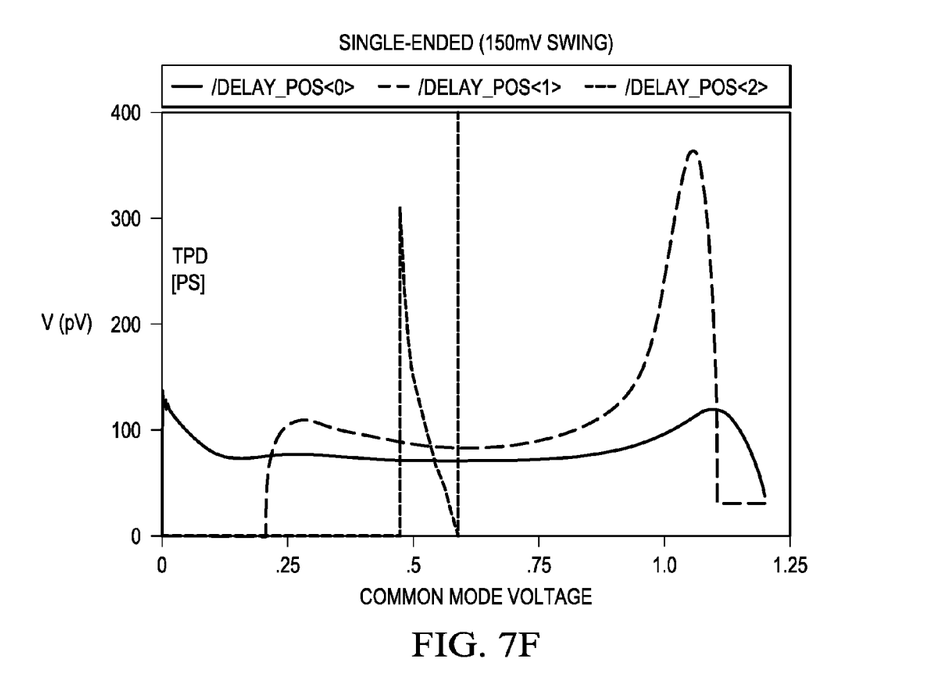
FIG. 7F illustrates a sixth simulation of the various above circuits.
Figure 7G:
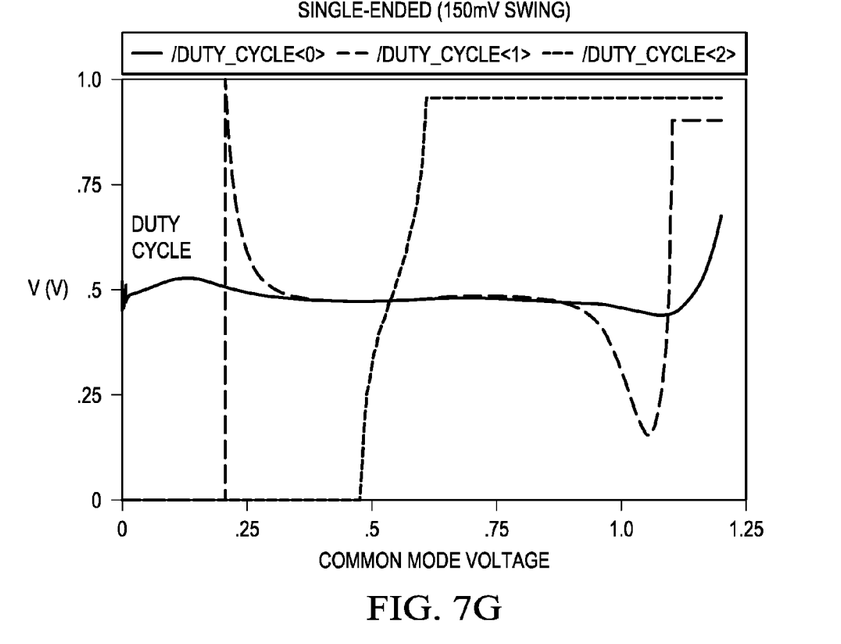
FIG. 7G illustrates a seventh simulation of the various above circuits.
Figure 7H:
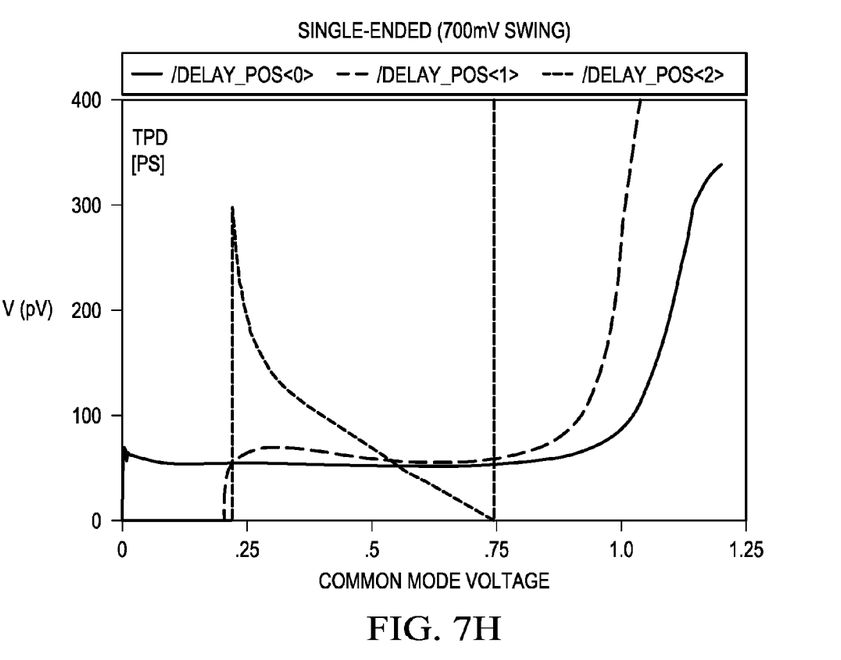
FIG. 7H illustrates an eight simulation of the various above circuits.
Figure 7I:
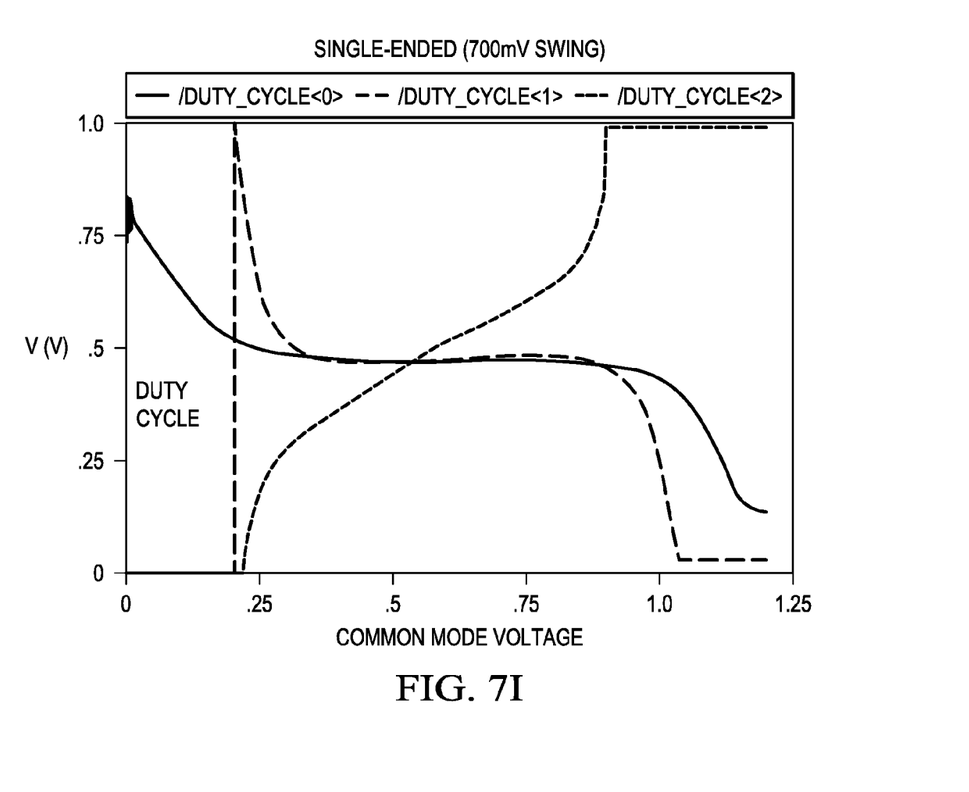
FIG. 7I illustrates a ninth simulation of the various above circuits.

Turning to FIG. 6, an equal circuit can be designed for single-ended input. 600.

Turning to FIGS. 7A, 7B, 7C, 7D, 7E, 7F, 7G, 7H, and 7I, simulations have been done for single-ended and differential input signals and for 150 mV and 700 mV signal swing (see pictures at the end of this paper). The supply voltage is 1.2V and the input common mode voltage has been ramped from 0V to 1.2V (on the x-axis). On the y-axis, the duty-cycle and propagation delay time (input to output) is shown. The result is shown for circuit of FIG. 1 (dotted, blue), FIG. 3 (dashed, blue) and FIG. 4 (solid, red).

Notable is the constant propagation delay time and duty-cycle over a wide input common mode range of the new circuit (FIG. 4). For critical timings the dependency upon input signal shapes (data and/or clock-signal) is canceled out almost.

Those skilled in the art to which this application relates will appreciate that other and further additions, deletions, substitutions and modifications may be made to the described embodiments.

What is claimed is:

1. An apparatus, comprising:
   a differential input stage to receive input signals IN_P and IN_N and provide output signals OUT_P and OUT_N;
   the differential input stage including
      a first differential input PMOS/NMOS transistor pair to receive IN_P, and to generate an inverted IN_P at a differential output node S1, which is coupled to an output inverter INV1 to generate OUT_P;
      a second differential input PMOS/NMOS transistor pair to receive IN_N, and to generate an inverted IN_N at a differential output node S2, which is coupled to an output inverter INV0 to generate OUT_N; and
      a bias network to implement a common mode control loop to generate a bias control voltage, and including
         a high bias PMOS transistor coupled between a high rail and respective PMOS transistors of the first and second PMOS/NMOS transistor pairs, and to receive the bias control voltage;
         a low bias NMOS transistor coupled between a low rail and respective NMOS transistors of the first and second PMOS/NMOS transistor pairs, and to receive the bias control voltage;
         a common mode control circuit including
            a half-replica PMOS/NMOS transistor pair that is a replica of a selected one of the first and second differential input PMOS/NMOS transistor pairs, to receive a common mode control voltage Vthreshold, and to generate an inverted Vthreshold voltage at a Vthreshold node;
            a replica high bias PMOS transistor and a replica low bias NMOS transistor that are respectively a replica of the high bias PMOS and low bias NMOS transistors, coupled respectively between the high rail and the replica PMOS transistor, and the low rail and the replica NMOS transistor, to receive the bias control voltage;
            a replica output inverter that is a replica of a respective one of the output inverter INV1 and output inverter INV0, with an output shorted to an input; and
            an amplifier to receive at a non-inverting input the inverted Vthreshold voltage, and at an inverting input an output of the replica output inverter, and to generate the bias control voltage; and
   the differential input stage further including common mode range control circuitry including
      a third PMOS/NMOS transistor pair to provide a first current source load, with PMOS and NMOS transistors coupled respectively between the high and low rails and the differential output node S1;
      a fourth PMOS/NMOS transistor pair to provide a second current source load, with PMOS and NMOS transistors coupled respectively between the high and low rails and the differential output node S2; and
      a replica PMOS/NMOS transistor pair to provide a replica current source load that is a replica of a selected one of the first and second current source loads, with PMOS and NMOS transistors coupled respectively between the high/low rail and the Vthreshold node.

2. The apparatus of claim 1, wherein the respective PMOS and NMOS transistors of the first and second current source loads are sized respectively relative to the high bias PMOS and low bias NMOS transistors for an optimal operation mode.

3. The apparatus of claim 1, wherein the amplifier comprises an operational amplifier.

4. The apparatus of claim 1, wherein the propagation delay time through the differential input stage relative to common mode voltage is substantially constant.

5. The apparatus of claim 1, wherein the duty-cycle of the differential input stage relative to common mode voltage is substantially constant.

* * * * *